(12) United States Patent
Kang

(10) Patent No.: US 10,062,393 B2
(45) Date of Patent: Aug. 28, 2018

(54) METHOD FOR RECORDING SOUND OF VIDEO-RECORDED OBJECT AND MOBILE TERMINAL

(71) Applicant: Huawei Technologies Co., Ltd., Shenzhen, Guangdong (CN)

(72) Inventor: Junteng Kang, Shanghai (CN)

(73) Assignee: Huawei Technologies Co., Ltd., Shenzhen (CN)

(*) Notice: Subject to any disclaimer, the term of this patent is extended or adjusted under 35 U.S.C. 154(b) by 0 days.

(21) Appl. No.: 15/607,124

(22) Filed: May 26, 2017

(65) Prior Publication Data

US 2017/0263264 A1 Sep. 14, 2017

Related U.S. Application Data

(63) Continuation of application No. PCT/CN2014/092534, filed on Nov. 28, 2014.

(51) Int. Cl.

| G10L 25/57 | (2013.01) |
|---|---|
| G10L 21/028 | (2013.01) |
| G11B 27/031 | (2006.01) |
| H03G 3/32 | (2006.01) |
| H03G 5/16 | (2006.01) |
| H03G 5/00 | (2006.01) |

(52) U.S. Cl.
CPC ............ G10L 21/028 (2013.01); G10L 25/57 (2013.01); G11B 27/031 (2013.01); *H03G 3/32* (2013.01); *H03G 5/005* (2013.01); *H03G 5/16* (2013.01)

(58) Field of Classification Search
CPC ..... G10L 21/026; G10L 25/57; G11B 27/031; H03G 5/005; H03G 3/32; H03G 5/16

USPC .......................... 381/56–57, 91–92, 355–357
See application file for complete search history.

(56) References Cited

U.S. PATENT DOCUMENTS

| 7,873,349 B1 | 1/2011 | Smith et al. |
|---|---|---|
| 2007/0265850 A1 | 11/2007 | Kennewick et al. |
| 2012/0224714 A1 | 9/2012 | Couse et al. |
| 2013/0060571 A1* | 3/2013 | Soemo ..................... G10L 15/30 704/251 |
| 2013/0342731 A1* | 12/2013 | Lee ..................... H04N 5/23293 348/231.4 |
| 2013/0343572 A1* | 12/2013 | Lee ......................... H04M 1/03 381/92 |

FOREIGN PATENT DOCUMENTS

| CN | 102685339 A | 9/2012 |
|---|---|---|
| CN | 102903362 A | 1/2013 |
| CN | 103414988 A | 11/2013 |

* cited by examiner

*Primary Examiner* — Melur Ramakrishnaiah

(57) ABSTRACT

Embodiments of the present disclosure disclose a method for recording sound of a video-recorded object and a mobile terminal, so as to reduce background noise in recorded sound of a video-recorded object, and improve quality of the recorded sound. The method in the embodiments of the present disclosure includes: obtaining, by a mobile terminal by means of facial recognition, position information of the video-recorded object; and performing processing on recorded sound signals, so as to enhance signal intensity of a sound signal at a position of the video-recorded object, and attenuate signal intensity of a sound signal at another position, to obtain sound at the position of the video-recorded object.

12 Claims, 4 Drawing Sheets

METHOD FOR RECORDING SOUND OF VIDEO-RECORDED OBJECT AND MOBILE TERMINAL

CROSS-REFERENCE TO RELATED APPLICATIONS

This application is a continuation of International Application No. PCT/CN2014/092534, filed on Nov. 28, 2014, the disclosure of which is hereby incorporated by reference in its entirety.

TECHNICAL FIELD

The present application relates to the field of data processing, and in particular, to a method for recording sound of a video-recorded object and a mobile terminal.

BACKGROUND

Image recording refers to recording an image by using an optical or electromagnetic method, or the like, for example, recording a motion of a child, or a foraging process of an animal. With development of electronic technologies, in an image recording process, sound recording is usually performed simultaneously, to obtain complete audio and video data.

At present, a position of a video-recorded object may dynamically change in an image recording process. Therefore, to acquire sound of the video-recorded object, omni-directional sound recording is usually performed in the image recording process, that is, sound enters a microphone from 0 degrees to 360 degrees, and there is no obvious output change.

However, in an actual application, if the omnidirectional sound recording is performed, when the sound of the video-recorded object is obtained, sound at all other angles may also be obtained, resulting in great background noise in a sound recording result, and quality of recorded sound is severely affected.

SUMMARY

Embodiments of the present disclosure provide a method for recording sound of a video-recorded object and a mobile terminal, so as to reduce background noise in recorded sound of a video-recorded object, and improve quality of the recorded sound.

A first aspect of the embodiments of the present disclosure provides a method for recording sound of a video-recorded object, including:

obtaining, by a mobile terminal in an image recording process by means of facial recognition, position information of the video-recorded object relative to the mobile terminal, where the position information includes angle information and distance information of the video-recorded object relative to the mobile terminal;

converting, by the mobile terminal, the position information into beam configuration information, where the beam configuration information is an input parameter of a beamforming technology; and performing, by the mobile terminal according to the beam configuration information, beamforming processing on recorded sound signals, so as to enhance signal intensity of a sound signal at a position of the video-recorded object, and attenuate signal intensity of a sound signal at another position, to obtain sound at the position of the video-recorded object.

With reference to the first aspect of the embodiments of the present disclosure, in a first implementation of the first aspect of the embodiments of the present disclosure, the beam configuration information includes a sound source position angle, a beam direction, and a beam width; and the converting, by the mobile terminal, the position information into beam configuration information specifically includes:

converting, by the mobile terminal, the angle information of the video-recorded object relative to the terminal into the sound source position angle and the beam direction; and converting, by the mobile terminal, the distance information of the video-recorded object relative to the terminal into the beam width, where a longer distance indicates a narrower beam width.

With reference to the first aspect or the first implementation of the first aspect of the embodiments of the present disclosure, in a second implementation of the first aspect of the embodiments of the present disclosure, the mobile terminal includes at least two microphones; and the performing, by the mobile terminal according to the beam configuration information, beamforming processing on recorded sound signals specifically includes:

adjusting, by the mobile terminal according to the beam configuration information, a parameter of a sound signal acquired by each microphone, so that after sound signals acquired by all the microphones in the mobile terminal are synthesized, only a sound signal at the position of the video-recorded object exits.

With reference to any one of the first aspect to the second implementation of the first aspect of the embodiments of the present disclosure, in a third implementation of the first aspect of the embodiments of the present disclosure, before the step of tracking, by means of facial recognition, the video-recorded object, the method further includes:

comparing, by the mobile terminal, each object in a recorded image with a stored preset object, to determine an object that is in the recorded image and that is the same as the preset object as the video-recorded object.

A second aspect of the embodiments of the present disclosure provides a mobile terminal, configured to record sound of a video-recorded object, including:

a recognition module, configured to obtain, in an image recording process by means of facial recognition, position information of the video-recorded object relative to the mobile terminal, where the position information includes angle information and distance information of the video-recorded object relative to the mobile terminal;

a conversion module, configured to convert the position information obtained by the recognition module into beam configuration information, where the beam configuration information is an input parameter of a beamforming technology; and a processing module, configured to perform, according to the beam configuration information, beamforming processing on recorded sound signals, so as to enhance signal intensity of a sound signal at a position of the video-recorded object, and attenuate signal intensity of a sound signal at another position, to obtain sound at the position of the video-recorded object.

With reference to the second aspect of the embodiments of the present disclosure, in a first implementation of the second aspect of the embodiments of the present disclosure, the beam configuration information includes a sound source position angle, a beam direction, and a beam width; and the conversion module specifically includes:

a first conversion unit, configured to convert the angle information of the video-recorded object relative to the mobile terminal into the sound source position angle and the beam direction; and a second conversion unit, configured to convert the distance information of the video-recorded object relative to the mobile terminal into the beam width, where a longer distance indicates a narrower beam width.

With reference to the second aspect or the first implementation of the second aspect of the embodiments of the present disclosure, in a second implementation of the second aspect of the embodiments of the present disclosure, the mobile terminal includes at least two microphones; and the processing module is specifically configured to adjust, according to the beam configuration information, a parameter of a sound signal acquired by each microphone, so that after sound signals acquired by all the microphones in the mobile terminal are synthesized, only a sound signal at the position of the video-recorded object exits, and the sound at the position of the video-recorded object is obtained.

With reference to any one of the second aspect to the second implementation of the second aspect of the embodiments of the present disclosure, in a third implementation of the second aspect of the embodiments of the present disclosure, the mobile terminal further includes:

a determining module, configured to: compare each object in a recorded image with a stored preset object, to determine an object that is in the recorded image and that is the same as the preset object as the video-recorded object.

A third aspect of the embodiments of the present disclosure provides a mobile terminal, configured to record sound of a video-recorded object, including:

a camera, a microphone, a processor, and a memory, where the camera obtains, in an image recording process by means of facial recognition, position information of the video-recorded object relative to the mobile terminal, where the position information includes angle information and distance information of the video-recorded object relative to the mobile terminal; and the microphone records a sound signal around the mobile terminal;

the camera transmits the obtained position information to the processor;

after receiving the position information, the processor converts the position information into beam configuration information by invoking an operation instruction stored in the memory, where the beam configuration information is an input parameter of a beamforming technology; and the processor performs, according to the beam configuration information obtained through conversion, beamforming processing on sound signals recorded by the microphone, so as to enhance signal intensity of a sound signal at a position of the video-recorded object, and attenuate signal intensity of a sound signal at another position, to obtain sound at the position of the video-recorded object.

With reference to the third aspect of the embodiments of the present disclosure, in a first implementation of the third aspect of the embodiments of the present disclosure, the beam configuration information includes a sound source position angle, a beam direction, and a beam width; and that after receiving the position information, the processor converts the position information into beam configuration information specifically includes:

after receiving the position information, the processor converts the angle information of the video-recorded object relative to the mobile terminal in the position information into the sound source position angle and the beam direction; and the processor converts the distance information of the video-recorded object relative to the mobile terminal in the position information into the beam width, where a longer distance indicates a narrower beam width.

With reference to the third aspect or the first implementation of the third aspect of the embodiments of the present disclosure, in a second implementation of the third aspect of the embodiments of the present disclosure, there are at least two microphones; and that the processor performs, according to the beam configuration information obtained through conversion, beamforming processing on sound signals recorded by the microphone specifically includes:

the processor adjusts, according to the beam configuration information obtained through conversion, a parameter of a sound signal acquired by each microphone, so that after sound signals acquired by all the microphones in the mobile terminal are synthesized, only a sound signal at the position of the video-recorded object exits.

With reference to the third aspect to the second implementation of the third aspect of the embodiments of the present disclosure, in a third implementation of the third aspect of the embodiments of the present disclosure, the memory further stores information about a preset object; and before the camera obtains, by means of facial recognition, the position information of the video-recorded object relative to the mobile terminal, the processor compares each object in a recorded image with the stored preset object, to determine an object that is in the recorded image and that is the same as the preset object as the video-recorded object.

It can be seen from the foregoing technical solutions that the embodiments of the present disclosure have the following advantages: In the embodiments of the present disclosure, a mobile terminal obtains, through tracking by means of facial recognition, position information of a video-recorded object, converts the position information into beam configuration information to be used as an input parameter of a beamforming technology, and performs beamforming processing on recorded sound signals, so as to enhance signal intensity of a sound signal at a position of the video-recorded object, and attenuate signal intensity of a sound signal at another position, to obtain sound at the position of the video-recorded object. In this way, impact of sound at another position on sound of the video-recorded object is avoided, and background noise in the recorded sound of the video-recorded object is reduced, thereby improving quality of the recorded sound.

DETAILED DESCRIPTION

The following clearly describes the technical solutions in the embodiments of the present disclosure with reference to the accompanying drawings in the embodiments of the present disclosure. Apparently, the described embodiments are merely some but not all of the embodiments of the present disclosure. All other embodiments obtained by a person skilled in the art based on the embodiments of the present disclosure without creative efforts shall fall within the protection scope of the present disclosure.

The term "facial recognition" represents a biometric recognition technology of identification based on feature information of a human face. A related technology of acquiring, by using a video camera or a camera, an image or a video stream that includes a human face, automatically detecting and tracking the human face in the image, and further performing a series of facial processing and recognition on the detected human face is usually referred to as portrait recognition or face recognition.

The term "beamforming" may also be referred to as spatial filtering, and is a signal processing technology of directionally sending and receiving signals by using a sensor array. The beamforming technology adjusts a parameter of a basic unit of a phase array, so that constructive interference is caused to signals at some angles while destructive interference is caused to signals at some other angles. Both a signal transmit end and a signal receive end may perform beamforming. At the transmit end, a beamformer controls a phase and a signal amplitude of each transmission apparatus, so as to obtain required constructive and destructive interference modes in a transmitted signal wave array. At the receive end, signals received by different receivers are combined in a proper manner, so as to obtain a required signal radiation mode.

Figure 1:
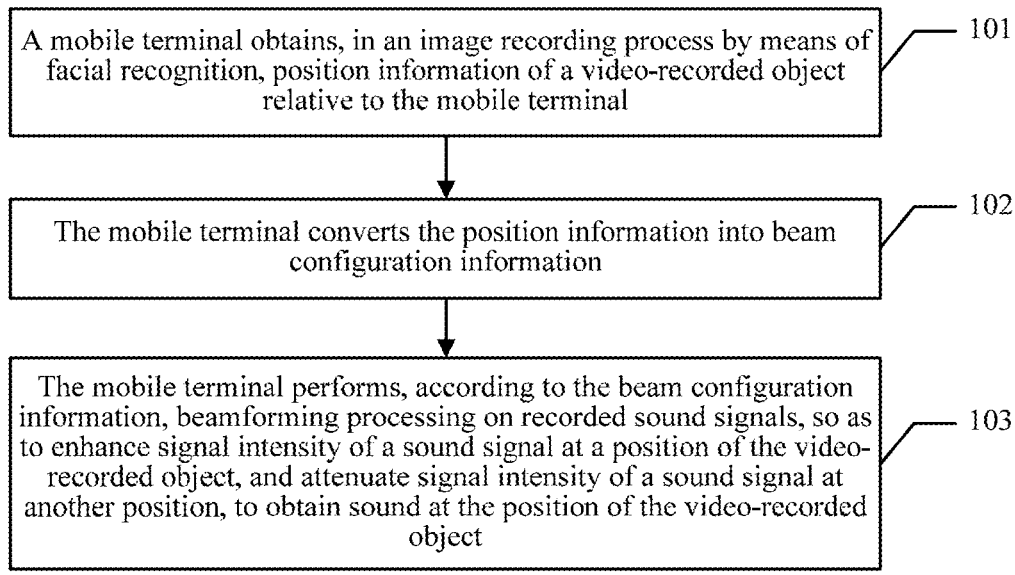
FIG. 1 is a schematic flowchart of a sound recording method during image recording according to an embodiment of the present disclosure.

Referring to FIG. 1, an embodiment of a method for recording sound of a video-recorded object in the embodiments of the present disclosure includes the following steps.

101: A mobile terminal obtains, in an image recording process by means of facial recognition, position information of a video-recorded object relative to the mobile terminal.

In an image recording process, a mobile terminal records an image signal and a sound signal. The mobile terminal obtains position information of a video-recorded object relative to the mobile terminal by performing, according to the recorded image signal, facial recognition on a recorded image represented by the image signal. The position information includes angle information and distance information of the video-recorded object relative to the mobile terminal.

It can be understood that when a position of the video-recorded object changes in the image recording process, the position information may change in real time.

102: The mobile terminal converts the position information into beam configuration information.

After obtaining the position information, the mobile terminal converts the position information into beam configuration information. The beam configuration information is an input parameter of a beamforming technology.

103: The mobile terminal performs, according to the beam configuration information, beamforming processing on recorded sound signals, so as to enhance signal intensity of a sound signal at a position of the video-recorded object, and attenuate signal intensity of a sound signal at another position, to obtain sound at the position of the video-recorded object.

After obtaining the beam configuration information, the terminal performs, according to the beam configuration information, beamforming processing on recorded sound signals, so as to enhance signal intensity of a sound signal at a position of the video-recorded object, and attenuate signal intensity of a sound signal at another position, to obtain sound at the position of the video-recorded object.

In this embodiment of the present disclosure, a mobile terminal obtains, by means of facial recognition, position information of a video-recorded object, converts the position information into beam configuration information to be used as an input parameter of a beamforming technology, and performs beamforming processing on recorded sound signals, so as to enhance signal intensity of a sound signal at a position of the video-recorded object, and attenuate signal intensity of a sound signal at another position, to obtain sound at the position of the video-recorded object. In this way, impact of sound at another position on sound of the video-recorded object is avoided, and background noise in the recorded sound of the dynamic video-recorded object is reduced, thereby improving quality of the recorded sound.

Figure 2:
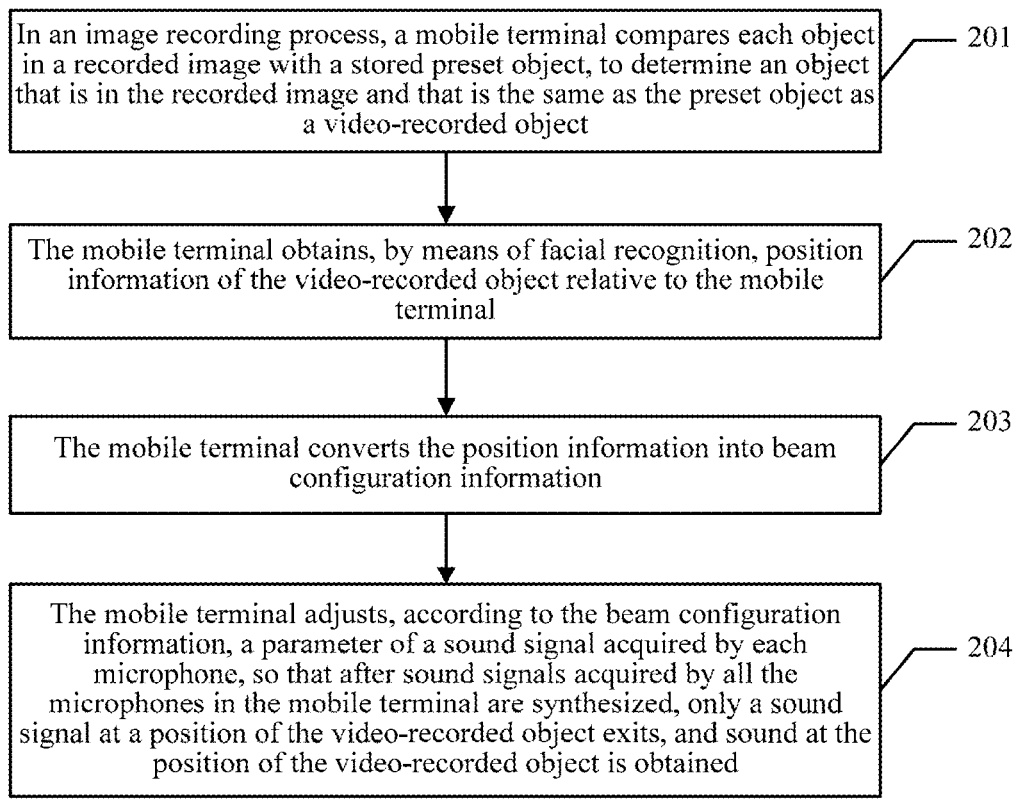
FIG. 2 is another schematic flowchart of a sound recording method during image recording according to an embodiment of the present disclosure.

The method for recording sound of a video-recorded object in the embodiments of the present disclosure is specifically described below. Referring to FIG. 2, another embodiment of the method for recording sound of a video-recorded object in the embodiments of the present disclosure includes the following steps.

201: In an image recording process, a mobile terminal compares each object in a recorded image with a stored preset object, to determine an object that is in the recorded image and that is the same as the preset object as a video-recorded object.

In an image recording process, a mobile terminal records an image signal and a sound signal. The mobile terminal compares, with a stored preset object according to the recorded image signal, each object in a recorded image represented by the image signal, to determine an object that is in the recorded image and that is the same as the preset object as a video-recorded object.

Specifically, the preset object may be stored in multiple manners. For example, the preset object may be a picture including the video-recorded object. Before the image recording, the terminal may receive or store the picture including the video-recorded object, and specifies a particular object in the picture as the video-recorded object. Alternatively, image information of the preset object may be directly input, or another manner may be used. This is not limited herein.

In addition, in the image recording process, the mobile terminal may further specify, by using object determining information, a particular object in the recorded image to be the video-recorded object. Alternatively, many other manners may be used. This is not limited herein.

It can be understood that in an actual application, step 201 may not be performed. The mobile terminal may automatically use all objects that are in the recorded image and that can be recognized by means of facial recognition as video-recorded objects. This is not limited herein.

202: The mobile terminal obtains, by means of facial recognition, position information of the video-recorded object relative to the mobile terminal.

After determining the video-recorded object, the mobile terminal obtains position information of the video-recorded object relative to the mobile terminal by performing facial recognition on the video-recorded object in the recorded image. The position information includes angle information and distance information of the video-recorded object relative to the mobile terminal.

It can be understood that when a position of the video-recorded object changes in the image recording process, the position information may change in real time.

Specifically, the position information may include an angle and a distance of a human face of the video-recorded object recognized by means of facial recognition. It can be understood that the position information may further include other information, for example, a motion tendency. This is not limited herein.

203: The mobile terminal converts the position information into beam configuration information.

After obtaining the position information, the mobile terminal converts the position information into beam configuration information. The beam configuration information is an input parameter of a beamforming technology.

Specifically, the beam configuration information may include a sound source position angle, a beam direction, and a beam width, and may further include other parameters, for example, a sampling rate, a microphone interval, and a maximum noise reduction amount. This is not limited herein.

Specifically, that the mobile terminal converts the position information into beam configuration information may be that the mobile terminal converts the angle information of the video-recorded object relative to the mobile terminal into the sound source position angle and the beam direction, and converts the distance information of the video-recorded object relative to the mobile terminal into the beam width. A longer distance indicates a narrower beam width.

204: The mobile terminal adjusts, according to the beam configuration information, a parameter of a sound signal acquired by each microphone, so that after sound signals acquired by all the microphones in the mobile terminal are synthesized, only a sound signal at a position of the video-recorded object exits, and sound at the position of the video-recorded object is obtained.

The mobile terminal includes at least two microphones. After obtaining the beam configuration information, the mobile terminal adjusts, according to the beam configuration information by using a beamforming technology, a parameter of a sound signal acquired by each microphone, to enhance signal intensity of a sound signal at a position corresponding to the video-recorded object, and attenuate signal intensity of a sound signal at another position, so that after sound signals obtained by all the microphones in the mobile terminal are synthesized, only a sound signal at the position of the video-recorded object exists, to obtain sound at the position of the video-recorded object.

In this embodiment of the present disclosure, a mobile terminal may compare each object in a recorded image with a stored preset object, to determine an object that is in the recorded image and that is the same as the preset object as a video-recorded object, so that required sound of the video-recorded object may be recorded more accurately.

Figure 3:
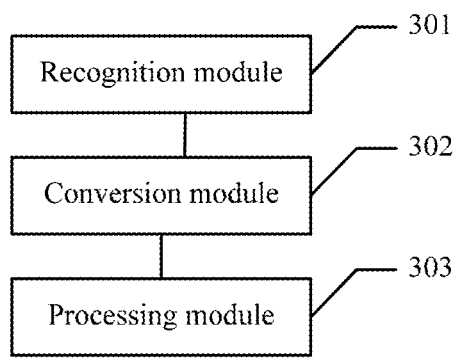
FIG. 3 is a schematic structural diagram of a terminal according to an embodiment of the present disclosure.

A mobile terminal in the embodiments of the present disclosure is described below. Referring to FIG. 3, an embodiment of the mobile terminal in the embodiments of the present disclosure includes:

a recognition module 301, configured to obtain, in an image recording process by means of facial recognition, position information of a video-recorded object relative to the mobile terminal, where the position information includes angle information and distance information of the video-recorded object relative to the mobile terminal;

a conversion module 302, configured to convert the position information obtained by the recognition module 301 into beam configuration information, where the beam configuration information is an input parameter of a beamforming technology; and a processing module 303, configured to perform, according to the beam configuration information, beamforming processing on recorded sound signals, so as to enhance signal intensity of a sound signal at a position of the video-recorded object, and attenuate signal intensity of a sound signal at another position, to obtain sound at the position of the video-recorded object.

In this embodiment of the present disclosure, the recognition module 301 obtains, through tracking by means of facial recognition, position information of a video-recorded object. The conversion module 302 converts the position information into beam configuration information to be used as an input parameter of a beamforming technology. The processing module 303 performs beamforming processing on recorded sound signals, so as to enhance signal intensity of a sound signal at a position of the video-recorded object, and attenuate signal intensity of a sound signal at another position, to obtain sound at the position of the video-recorded object. In this way, impact of sound at another position on sound of the video-recorded object is avoided, and background noise in the recorded sound of the dynamic video-recorded object is reduced, thereby improving quality of the recorded sound.

Figure 4:
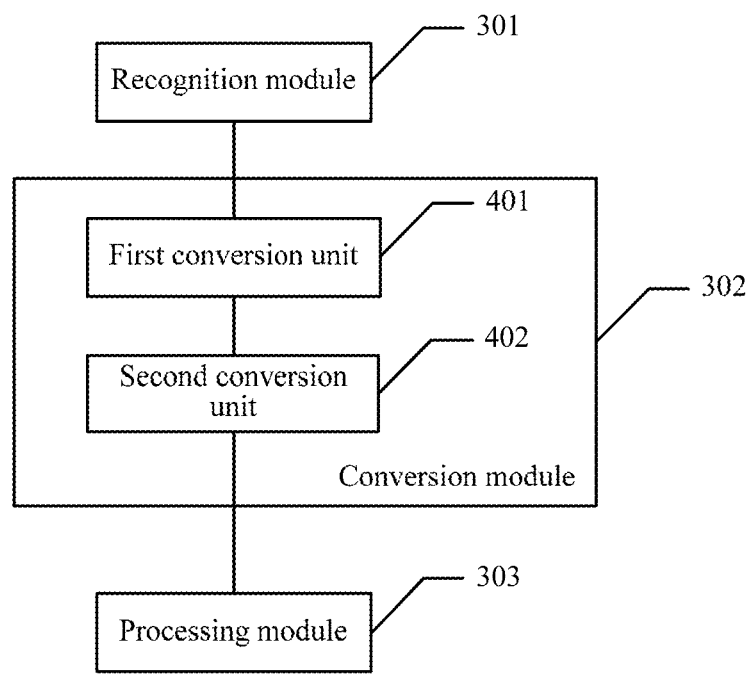
FIG. 4 is another schematic structural diagram of a terminal according to an embodiment of the present disclosure.

In the foregoing embodiment, the conversion module 302 converts the position information into the beam configuration information. In an actual application, the beam configuration information may include a sound source position angle, a beam direction, and a beam width. Referring to FIG. 4, in another embodiment of the mobile terminal in the embodiments of the present disclosure, the conversion module 302 in the mobile terminal specifically includes:

a first conversion unit 401, configured to convert the angle information of the video-recorded object relative to the mobile terminal into the sound source position angle and the beam direction; and a second conversion unit 402, configured to convert the distance information of the video-recorded object relative to the mobile terminal into the beam width, where a longer distance indicates a narrower beam width.

Specifically, the mobile terminal includes at least two microphones. The processing module 303 may be specifically configured to adjust, according to the beam configuration information, a parameter of a sound signal acquired by each microphone, so that after sound signals recorded by all the microphones in the terminal are synthesized, only a sound signal at the position of the video-recorded object exists, and the sound at the position of the video-recorded object is obtained.

In this embodiment, the conversion module 302 converts a particular parameter in position information obtained by means of facial recognition into a corresponding parameter in beam configuration information. Further, the processing module 303 may adjust a parameter of each microphone according to the beam configuration information, so that after sound signals recorded by all the microphones in the mobile terminal are synthesized, only a sound signal at a position of a video-recorded object exists, and only sound at the position corresponding to the video-recorded object is recorded.

Figure 5:
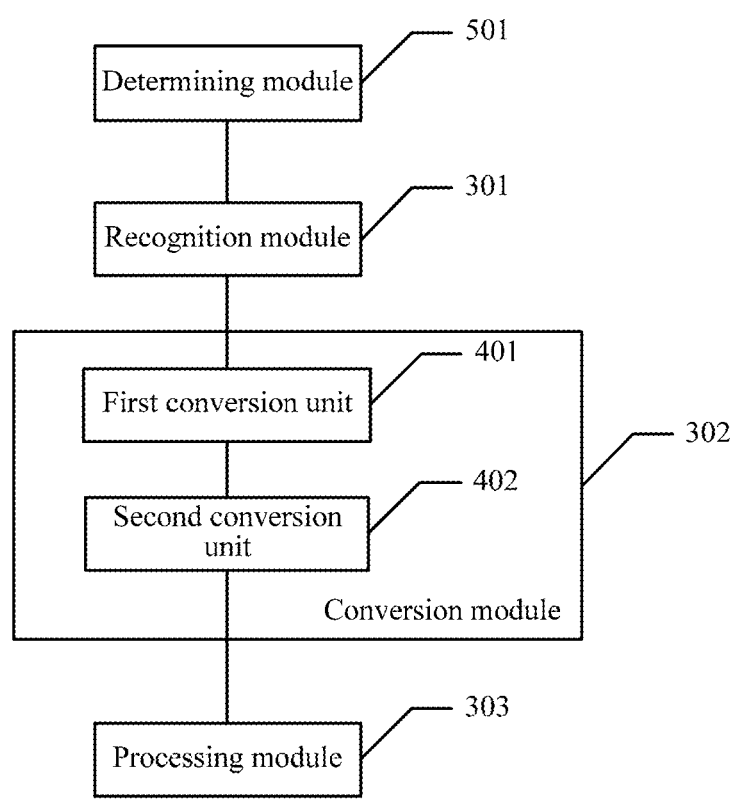
FIG. 5 is another schematic structural diagram of a terminal according to an embodiment of the present disclosure.

In the foregoing embodiment, the recognition module 301 tracks the video-recorded object by means of facial recognition. In an actual application, the video-recorded object may be determined as any object in a recorded image, or is a preset object stored in advance. Referring to FIG. 5, in another embodiment of the mobile terminal in the embodiments of the present disclosure, the mobile terminal further includes:

a determining module 501, configured to: compare each object in a recorded image with a stored preset object, to determine an object that is in the recorded image and that is the same as the preset object as the video-recorded object.

In this embodiment of the present disclosure, the determining module 501 may determine, according to a stored preset object, a video-recorded object through comparison, so that required sound of the video-recorded object can be recorded more accurately.

Figure 6:
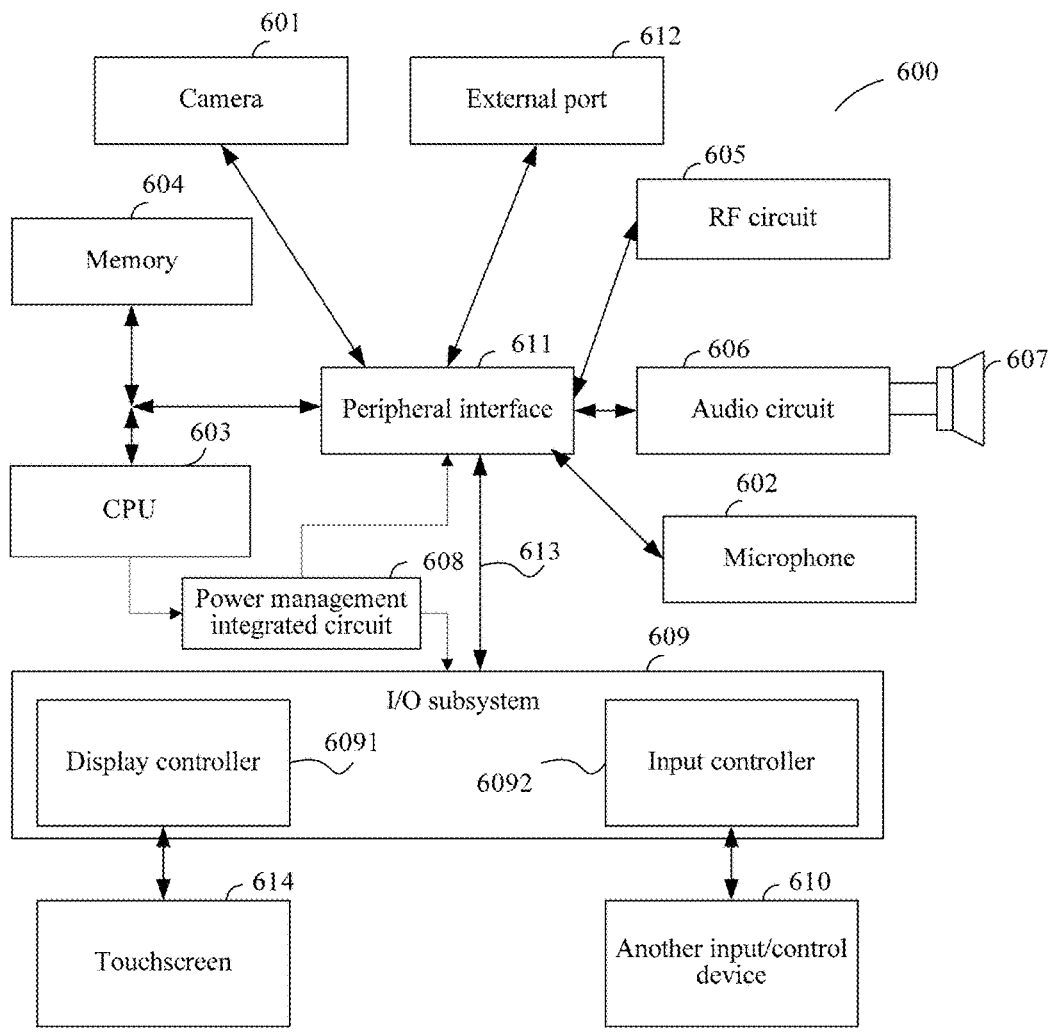
FIG. 6 is another schematic structural diagram of a terminal according to an embodiment of the present disclosure.

Referring to FIG. 6, another embodiment of a mobile terminal 600 in the embodiments of the present disclosure includes:

a camera 601, a microphone 602, a processor 603, and a memory 604.

The mobile terminal may further include an RF circuit 605, an audio circuit 606, a speaker 607, a power management integrated circuit 608, an input/output (I/O) subsystem 609, another input/control device 610, a peripheral interface 611, and an external port 612. The components communicate with each other by using one or more communications buses or signal cables 613.

The camera 601 may be connected to the processor 603 by using the peripheral interface 611. The microphone 602 may be connected to the audio circuit 606 and the processor 603 by using the periphery interface 611.

It should be noted that this embodiment provides an example of the mobile terminal. Compared with FIG. 7, the mobile terminal in this embodiment of the present disclosure may have more or fewer components, may combine two or more components, or may have different component configuration or setting. Each component may be implemented in hardware, software, or a combination of hardware and software that includes one or more signal processing circuits and/or one or more application-specific integrated circuits.

The mobile terminal provided in this embodiment is described in detail below.

The memory 604 may be accessed by the CPU 603 and the peripheral interface 611. The memory 604 may include a high-speed random access memory, and may also include a nonvolatile memory, for example, one or more magnetic storage devices, flash memories, or other volatile solid-state memories.

The peripheral interface 611 may connect input and output peripherals of the device to the CPU 603 and the memory 604.

The I/O subsystem 609 may connect the input and output peripherals, for example, a touchscreen 614 and the other input/control device 610, of the device to the peripheral interface 611. The I/O subsystem 609 may include a display controller 6091 and one or more input controllers 6092 for controlling the other input/control device 610. The one or more input controllers 6092 receive an electrical signal from the another input/control device 610 or send an electrical signal to the another input/control device 610, where the another input/control device 610 may include a physical button (a press button, a rocker button, or the like), a dial, a slide switch, a joystick, or an a click scroll wheel. It should be noted that the input controller 6092 may be connected to any one of the following: a keyboard, an infrared port, a USB interface, or an indication device such as a mouse.

The touchscreen 614 serves as an input interface and an output interface between the mobile terminal and a user, and displays a visible output to the user, where the visible output may include an image, text, an icon, a video, and the like.

The display controller 6091 in the I/O subsystem 609 receives an electrical signal from the touchscreen 614 or sends an electrical signal to the touchscreen 614. The touchscreen 614 detects a touch on the touchscreen. The display controller 6091 converts the detected touch into an interaction with a user interface object displayed on the touchscreen 614, that is, a human-computer interaction, where the user interface object displayed on the touchscreen 614 may be a game running icon, an icon linked to a corresponding network, or the like. It should be noted that the device may further include an optical mouse, where the optical mouse is a touch-sensitive surface that does not display a visible output, or an extension of a touch-sensitive surface formed by a touchscreen.

The RF circuit 605 is mainly configured to establish communication between the mobile terminal and a wireless network (that is, a network side), and implement data receiving and sending between the mobile terminal and the wireless network, for example, sending and receiving of an SMS message and an Email. Specifically, the RF circuit 605 receives and sends an RF signal, where the RF signal is also referred to as an electromagnetic signal. The RF circuit 605 converts an electrical signal into an electromagnetic signal or converts an electromagnetic signal into an electrical signal, and communicates with a communications network and another device by using the electromagnetic signal. The RF circuit 605 may include a known circuit configured to perform these functions. The known circuit includes, but is not limited to, an antenna system, an RF transceiver, one or more amplifiers, a tuner, one or more oscillators, a digital signal processor, a CODEC chip set, a subscriber identity module (Subscriber Identity Module, SIM), and the like.

The audio circuit 606 is mainly configured to: receive audio data from the peripheral interface 604, and convert the audio data into an electrical signal, and may send the electrical signal to the speaker 607.

The speaker 607 is configured to restore a speech signal received by a mobile phone from the wireless network by using the RF circuit 605 to sound, and play the sound to a user.

The power management integrated circuit 608 is configured to perform power supply and power supply management on the CPU 603, the I/O subsystem 609, and hardware connected to the peripheral interface 611.

Specifically, the camera 601 obtains, in an image recording process by means of facial recognition, position information of a video-recorded object relative to the mobile terminal. The position information includes angle information and distance information of the video-recorded object relative to the mobile terminal. The microphone 602 records a sound signal around the mobile terminal.

The camera 601 transmits the obtained position information to the processor 603.

After receiving the position information, the processor 603 converts the position information into beam configuration information by invoking an operation instruction stored in the memory 601. The beam configuration information is an input parameter of a beamforming technology.

The processor 603 performs, according to the beam configuration information obtained through conversion, beamforming processing on sound signals recorded by the microphone 602, so as to enhance signal intensity of a sound signal at a position of the video-recorded object, and attenuate signal intensity of a sound signal at another position, to obtain sound at the position of the video-recorded object.

Optionally, the beam configuration information includes a sound source position angle, a beam direction, and a beam width. After receiving the position information, the processor 603 may convert the angle information of the video-recorded object relative to the mobile terminal in the position information to the sound source position angle and the beam direction, and convert the distance information of the video-recorded object relative to the mobile terminal in the position information to the beam width. A longer distance indicates a narrower beam width.

Optionally, there are at least two microphones 602. The processor 603 may adjust, according to the beam configuration information obtained through conversion, a parameter of a sound signal acquired by each microphone 602, so that after sound signals acquired by all the microphones 602 are synthesized, only a sound signal at the position of the video-recorded object exists.

Optionally, the memory 604 further stores information about a preset object. Before the camera 601 obtains, by means of facial recognition, the position information of the video-recorded object relative to the mobile terminal, the processor 603 may compare each object in a recorded image with the stored preset object, to determine an object that is in the recorded image and that is the same as the preset object as the video-recorded object.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein again.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual requirements to achieve the objectives of the solutions of the embodiments.

In addition, functional units in the embodiments of the present disclosure may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of the present disclosure essentially, or the part contributing to the prior art, or all or some of the technical solutions may be implemented in the form of a software product. The software product is stored in a storage medium and includes several instructions for instructing a computer device (which may be a personal computer, a server, or a network device) to perform all or some of the steps of the methods described in the embodiments of the present disclosure. The foregoing storage medium includes: any medium that can store program code, such as a USB flash drive, a removable hard disk, a read-only memory (ROM, Read-Only Memory), a random access memory (RAM, Random Access Memory), a magnetic disk, or an optical disc.

The foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of the present disclosure.

What is claimed is:

1. A method for recording sound of a video-recorded object, the method comprising:
   obtaining, by a mobile terminal in an image recording process by means of facial recognition, position information of the video-recorded object relative to the mobile terminal;
   converting, by the mobile terminal, the position information into beam configuration information, wherein the beam configuration information is an input parameter of a beamforming technology; and
   performing, by the mobile terminal according to the beam configuration information, beamforming processing on recorded sound signals to enhance signal intensity of a sound signal at a position of the video-recorded object, and attenuate signal intensity of a sound signal at another position, to obtain sound at the position of the video-recorded object.

2. The method according to claim 1, wherein the position information comprises angle information and distance information of the video-recorded object relative to the mobile terminal.

3. The method according to claim 1, wherein:
   the beam configuration information comprises a sound source position angle, a beam direction, and a beam width; and
   converting, by the mobile terminal, the position information into beam configuration information comprises:
      converting, by the mobile terminal, the angle information of the video-recorded object relative to the terminal into the sound source position angle and the beam direction, and
      converting, by the mobile terminal, the distance information of the video-recorded object relative to the terminal into the beam width, wherein a longer distance indicates a narrower beam width.

4. The method according to claim 3, wherein:
   the mobile terminal comprises at least two microphones; and performing, by the mobile terminal according to the beam configuration information, beamforming processing on the recorded sound signals comprises:
adjusting, by the mobile terminal according to the beam configuration information, a parameter of a sound signal acquired by each microphone, so that after sound signals acquired by all the microphones in the mobile terminal are synthesized, only a sound signal at the position of the video-recorded object exits.

5. A mobile terminal, configured to record sound of a video-recorded object, the mobile terminal comprising:
a processor; and
memory coupled to the processor, the memory comprising instructions that, when executed by the processor, cause the mobile terminal to:
obtain, in an image recording process by means of facial recognition, position information of the video-recorded object relative to the mobile terminal,
convert the position information into beam configuration information, wherein the beam configuration information is an input parameter of a beamforming technology; and
perform, according to the beam configuration information, beamforming processing on recorded sound signals to enhance signal intensity of a sound signal at a position of the video-recorded object, and attenuate signal intensity of a sound signal at another position, to obtain sound at the position of the video-recorded object.

6. The mobile terminal according to claim 5, wherein the position information comprises angle information and distance information of the video-recorded object relative to the mobile terminal.

7. The mobile terminal according to claim 5, wherein:
the beam configuration information comprises a sound source position angle, a beam direction, and a beam width; and
the instructions, when executed by the processor, cause the mobile terminal to:
convert the angle information of the video-recorded object relative to the mobile terminal into the sound source position angle and the beam direction, and
convert the distance information of the video-recorded object relative to the mobile terminal into the beam width, wherein a longer distance indicates a narrower beam width.

8. The mobile terminal according to claim 5, further comprising:
at least two microphones; and
wherein the instructions, when executed by the processor, cause the mobile terminal to adjust, according to the beam configuration information, a parameter of a sound signal acquired by each microphone, so that after sound signals acquired by all the microphones in the mobile terminal are synthesized, only a sound signal at the position of the video-recorded object exits, and the sound at the position of the video-recorded object is obtained.

9. A mobile terminal, configured to record sound of a video-recorded object, the mobile terminal comprising:
a camera configured to:
obtain, in an image recording process by means of facial recognition, position information of the video-recorded object relative to the mobile terminal, and transmit the obtained position information;
a microphone configured to record sound signals around the mobile terminal; and
a processor configured to:
receive the position information;
convert the position information into beam configuration information by invoking an operation instruction stored in the memory, where the beam configuration information is an input parameter of a beamforming technology; and
perform, according to the beam configuration information obtained through conversion, beamforming processing on the recorded sound signals to enhance signal intensity of a sound signal at a position of the video-recorded object, and attenuate signal intensity of a sound signal at another position, to obtain sound at the position of the video-recorded object.

10. The mobile terminal according to claim 9, wherein the position information comprises angle information and distance information of the video-recorded object relative to the mobile terminal.

11. The mobile terminal according to claim 9, wherein:
the beam configuration information comprises a sound source position angle, a beam direction, and a beam width; and
the processor is configured to:
convert the angle information of the video-recorded object relative to the mobile terminal in the position information into the sound source position angle and the beam direction, and
convert the distance information of the video-recorded object relative to the mobile terminal in the position information into the beam width, wherein a longer distance indicates a narrower beam width.

12. The mobile terminal according claim 9, further comprising:
at least a second microphone; and
the processor is configured to adjust, according to the beam configuration information obtained through conversion, a parameter of a sound signal acquired by each microphone, so that after sound signals acquired by all the microphones in the mobile terminal are synthesized, only a sound signal at the position of the video-recorded object exits.

* * * * *